(12) United States Patent
Harada et al.

(10) Patent No.: US 6,743,316 B2
(45) Date of Patent: Jun. 1, 2004

(54) MULTILAYERED CERAMIC SUBSTRATE AND PRODUCTION METHOD THEREFOR

(75) Inventors: Hideyuki Harada, Omihachiman (JP); Hirofumi Sunahara, Moriyama (JP)

(73) Assignee: Murata Manufacturing Co. Ltd

( * ) Notice: Subject to any disclaimer, the term of this patent is extended or adjusted under 35 U.S.C. 154(b) by 0 days.

(21) Appl. No.: 10/001,316

(22) Filed: Nov. 1, 2001

(65) Prior Publication Data

US 2002/0062552 A1 May 30, 2002

(30) Foreign Application Priority Data

Nov. 27, 2000 (JP) ........................................ 2000-359025

(51) Int. Cl.[7] .............................. B32B 31/26; H05K 3/46
(52) U.S. Cl. .................................. 156/89.11; 156/89.12; 156/89.16
(58) Field of Search ..................... 156/89.11, 89.12, 156/89.16, 289; 29/851; 428/210, 901

(56) References Cited

U.S. PATENT DOCUMENTS

| | | | | |
|---|---|---|---|---|
| 5,858,145 A | * | 1/1999 | Sreeram et al. ...... 156/89.12 X |
| 6,337,123 B1 | * | 1/2002 | Ryugo et al. ............... 428/210 |
| 6,432,239 B1 | * | 8/2002 | Mandai et al. ........... 156/89.12 |
| 6,517,924 B1 | * | 2/2003 | Kameda et al. ............. 428/138 |
| 6,579,392 B1 | * | 6/2003 | Kameda et al. .......... 156/89.11 |

FOREIGN PATENT DOCUMENTS

| | | |
|---|---|---|
| JP | 09-039160 | 2/1997 |
| JP | 09-181449 | 7/1997 |
| JP | 2000-25157 | 1/2000 |

OTHER PUBLICATIONS

Japanese Office Action mailed Nov. 21, 2003.

* cited by examiner

*Primary Examiner*—Melvin C. Mayes
(74) *Attorney, Agent, or Firm*—Dickstein, Shapiro, Morin & Oshinsky, LLP.

(57) ABSTRACT

In a ceramic green-sheet stack to be fired to form a multi-layered ceramic substrate having a cavity, a shrinkage-reducing pad is formed along a boundary interface between first ceramic green sheets having an opening for defining a cavity, and second ceramic green sheets having no opening. The shrinkage-reducing pad is exposed on the entire periphery of the inner peripheral surface of the cavity at the bottom end of the inner peripheral surface. The shrinkage-reducing pad contains a glass component, and serves to reduce shrinkage stress produced at the boundary interface between the first and second ceramic green sheets during the firing process.

12 Claims, 2 Drawing Sheets

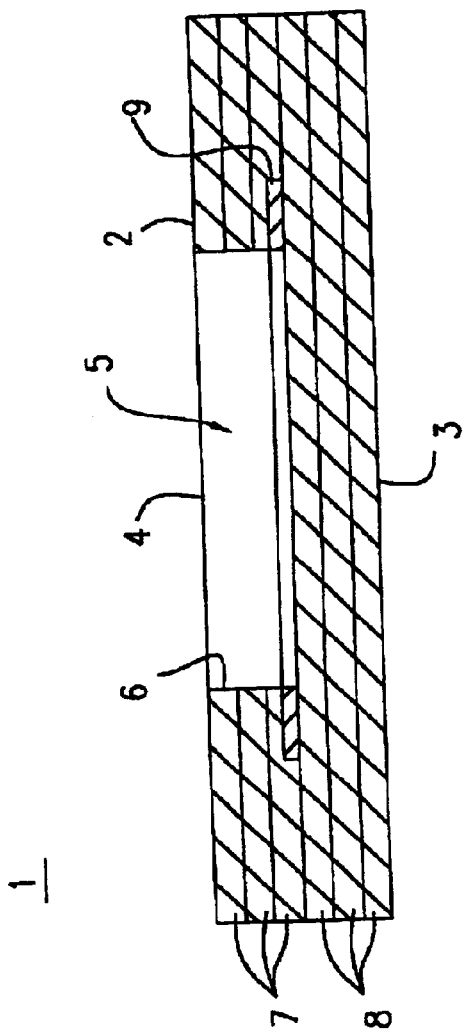
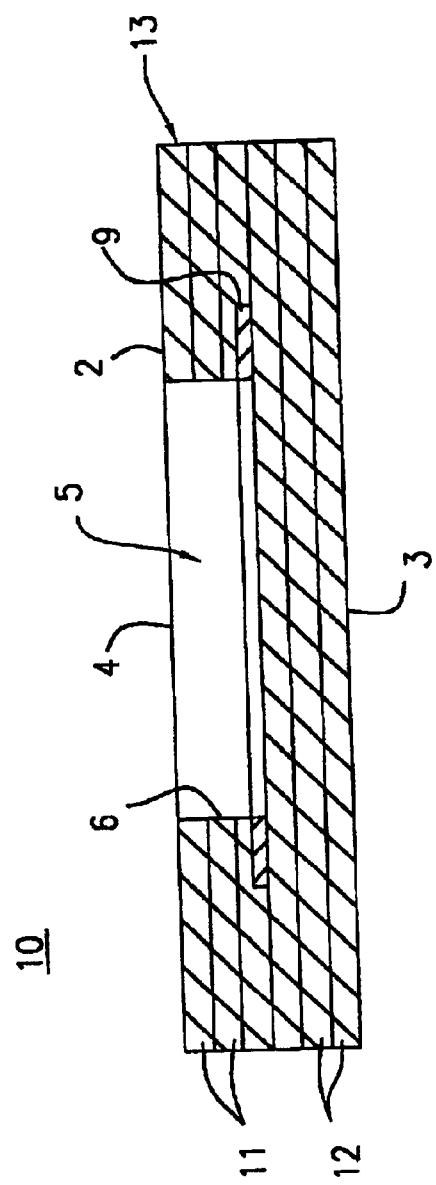

MULTILAYERED CERAMIC SUBSTRATE AND PRODUCTION METHOD THEREFOR

BACKGROUND OF THE INVENTION

1. Field of the Invention

The present invention relates to a multilayered ceramic substrate and to a production method therefor. More particularly, the present invention relates to a multilayered ceramic substrate having a cavity for mounting and holding an electronic component therein, and to a production method therefor.

2. Description of the Related Art

In recent years, there has been an increasing demand for smaller and lighter electronic components having more functions, higher reliability, and the like. Consequently, there has been a need to increase the density of wiring on substrates.

In order to respond to the need for such an increase in density of wiring of the substrates, multilayered ceramic substrates produced by stacking a plurality of ceramic green sheets having conductive films and the like printed thereon, and by pressing and firing the ceramic green sheets, have been developed.

In order to reduce the size and thickness of the multilayered ceramic substrate itself, it is effective to form, in the multilayered ceramic substrate, a cavity for mounting an electronic component therein.

In such a multilayered ceramic substrate having a cavity, however, an end of a bottom face portion of the cavity is prone to cracking during the firing process. It is thought that such cracking occurs because it is difficult, due to the existence of the cavity, to press the entire green-sheet stack, which becomes a multilayered ceramic substrate, at a uniform pressure before the firing process, causing residual stress to be applied to the end of the bottom face portion of the cavity.

In order to solve the above problem, a method is disclosed in Japanese Unexamined Patent Application Publication No. 9-39160, in which a green-sheet stack having a cavity is vacuum-packed while being sandwiched between a pair of rubber sheets, and is subjected to isostatic pressing in a stationary fluid.

Japanese Unexamined Patent Application Publication No. 9-181449 discloses a method in which a green-sheet stack is pressed by an elastic member having a protuberance of the same shape as that of the cavity.

While both of the above methods aim to apply uniform pressure to the entire green-sheet stack, this is, in reality, quite difficult. For example, in the method disclosed in Japanese Unexamined Patent Application Publication No. 9-181449, it is necessary to minutely and strictly define the shape and properties of the elastic member to be used. Furthermore, it is almost impossible for any type of elastic member to apply a completely uniform pressure to the entire green-sheet stack.

That is, it is almost impossible to overcome the problem of the locally remaining stresses in the methods which attempt to apply a uniform pressure to the green-sheet stack having a cavity in the pressing process. For this reason, shrinkage stress is imposed in the firing process. Under the present circumstances, it is impossible, depending on the way in which the shrinkage stress is imposed, to completely prevent cracking from at the periphery of the bottom face portion of the cavity.

SUMMARY OF THE INVENTION

Accordingly, it is an object of the present invention to provide a method for producing a multilayered ceramic substrate which can overcome the above-described problems, and to provide a multilayered ceramic substrate obtained by the production method.

In order to achieve the above object, according to an aspect of the present invention, there is provided a method for producing multilayered ceramic substrate having a cavity including the steps of: forming a first ceramic green sheet having an opening for forming a cavity, and a second ceramic green sheet having no opening at least at a position corresponding to the opening; forming a green-sheet stack having a cavity defined by the opening by stacking the first ceramic green sheet and the second ceramic green sheet so that an aperture of the cavity is placed on at least one end face of the ceramic green sheets in the sheet-stacking direction; firing the green-sheet stack; and preparing a shrinkage-reducing material for reducing shrinkage stress produced at an interface between the first ceramic green sheet and the second ceramic green sheet, wherein the step of forming the green-sheet stack includes the step of making a shrinkage-reducing layer of the shrinkage-reducing material along the boundary interface between the first ceramic green sheet and the second ceramic green sheet so that the shrinkage-reducing layer is exposed at the bottom end of the inner peripheral surface of the cavity.

In this case, shrinkage stress produced at the end of the bottom face portion of the cavity during the firing process is reduced, and cracking will not occur thereat. This makes it possible to produce a highly reliable multilayered ceramic substrate.

Furthermore, since shrinkage stress produced at the end of the bottom face portion of the cavity during the firing process is reduced, as described above, it is unnecessary to minutely and strictly define the shape and properties of an elastic member if used in the step of pressing the green-sheet stack before firing. This makes it possible to reduce the equipment cost in the pressing step, and to enhance the efficiency of the pressing step.

Preferably, the shrinkage-reducing layer is exposed on the entire periphery of the inner peripheral surface of the cavity as a shrinkage-reducing pad.

Preferably, the area of the shrinkage-reducing pad is more than or equal to about 10% of the area of the principal surface of the first ceramic green sheet. Alternatively, the shrinkage-reducing pad is formed in a layer having a planar shape substantially identical to that of the first ceramic green sheet along the interface between the first ceramic green sheet and the second ceramic green sheet. This allows the shrinkage-reducing pad to reliably achieve the effect of reducing shrinkage stress.

Preferably, the thickness of the shrinkage-reducing pad is less than or equal to about 20% of the depth of the cavity. This makes it possible to prevent the side wall portion of the cavity from undergoing undesired deformation.

Preferably, the shrinkage-reducing pad contains a glass component, and the softening temperature of the glass component is less than or equal to the shrinkage starting temperature of the first and second ceramic green sheets.

Preferably, the first and second ceramic green sheets contain a glass component. In this case, it is preferable that the content of the glass component in the first and second ceramic green sheets is less than the content of the glass component in the shrinkage-reducing pad. This makes it possible to easily provide the shrinkage-reducing pad with required properties.

Preferably, the glass component contained in the shrinkage-reducing pad includes a constituent of the same type as that of the glass component contained in the first and second ceramic green sheets. In this case, it is more preferable that the glass component contained in the shrinkage-reducing pad be of the same type as the glass component contained in the first and second ceramic green sheets. In this case, it is possible to increase the bonding strength at the interface between the shrinkage-reducing pad and the first and second ceramic green sheets after firing.

The present invention is also applicable to a method for producing multilayered ceramic substrate using a so-called shrinkage-reducing process which substantially prevents a green-sheet stack from being shrunk in the direction of the principal surface thereof during a firing process.

Preferably, the multilayered ceramic substrate production method further includes a step of preparing a shrinkage-inhibiting inorganic material having a firing temperature greater than that of a ceramic material contained in the first and second ceramic green sheet. In the step of forming the green-sheet stack, a shrinkage-inhibiting layer containing the shrinkage-inhibiting inorganic material is formed to cover end faces of the green-sheet stack in the sheet-stacking direction while the opening is formed so as to expose the aperture of the cavity therefrom. The step of firing the green-sheet stack is carried on a condition that the ceramic material contained in the first and second green sheets is fired.

In this case, since first and second ceramic layers can be obtained from the first and second ceramic green sheets without substantially causing shrinkage in the direction of the principal surface, the multilayered ceramic substrate obtained is less prone to nonuniform deformation. For this reason, it is possible to prevent wiring conductors disposed in connection with the multilayered ceramic substrate from undergoing undesired deformation and strain, and to smoothly increase the density of the wiring conductors.

The multilayered ceramic substrate production method may further include a step of removing the shrinkage-inhibiting layer after the firing step.

The present invention is also applicable to a multilayered ceramic substrate obtained by the above-described production method.

According to another aspect of the present invention, there is provided a multilayered ceramic substrate having a stack to be obtained by a firing process, wherein the stack includes a first ceramic layer having an opening for defining a cavity, a second ceramic layer having no opening at least at a position corresponding to the opening, the first ceramic layer and the second ceramic layer being stacked, and a cavity defined by the opening and having an aperture on at least one end face in the sheet-stacking direction, wherein a shrinkage-reducing pad is formed along at least a part of an interface between the first ceramic layer and a second ceramic layer so as to be exposed at the bottom end of the inner peripheral surface of the cavity, and wherein the shrinkage-reducing pad contains a shrinkage-reducing material for reducing shrinkage stress produced at the interface between the first ceramic layer and the second ceramic layer during the firing process.

Further objects, features and advantages of the present invention will become apparent from the following description of the preferred embodiments with reference to the attached drawings.

BRIEF DESCRIPTION OF THE DRAWINGS

FIG. 1 is a sectional view illustrating a green-sheet stack which is obtained in the course of the procedure for producing a multilayered ceramic substrate by a production method according to an embodiment of the present invention.

FIG. 2 is a sectional view illustrating a multilayered ceramic substrate which is obtained by firing the green-sheet stack 1 shown in FIG. 1.

DESCRIPTION OF THE PREFERRED EMBODIMENTS

Figure 3:
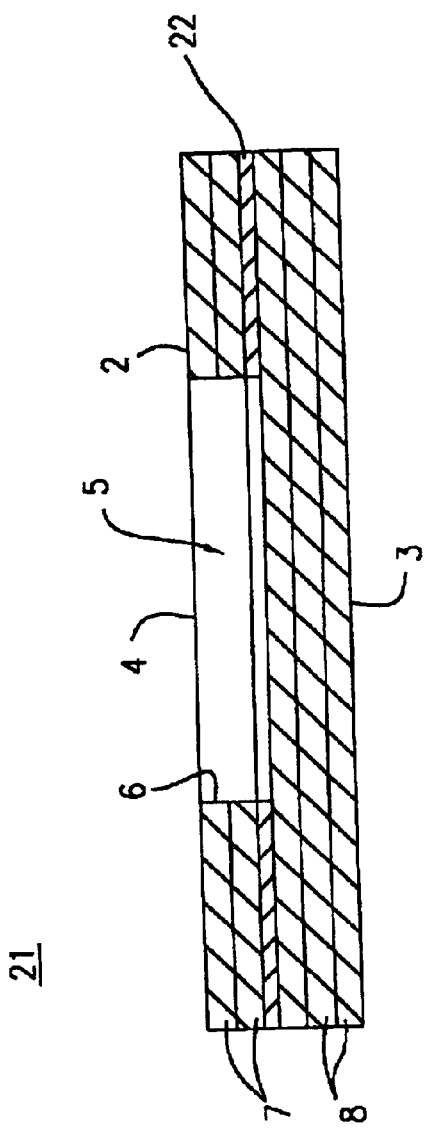
FIG. 3 is a sectional view illustrating a green-sheet stack which is obtained in the course of the procedure for producing a multilayered ceramic substrate by a production method according to another embodiment of the present invention.

FIG. 1 is a sectional view illustrating a green-sheet stack 1 which is obtained in the course of the procedure for producing a multilayered ceramic substrate by a production method according to an embodiment of the present invention.

The green-sheet stack 1 has first and second end faces 2 and 3 at both ends in the sheet-stacking direction. A cavity 5 is formed with an aperture 4 placed at the first end face 2.

In order to produce such a green-sheet stack 1, a plurality of first ceramic green sheets 7 each of which has an opening 6 for constituting the cavity 5, and a plurality of second ceramic green sheets 8 which have no opening are prepared. The first and second ceramic green sheets 7 and 8 may be made of glass ceramic containing a glass component.

The green-sheet stack 1 is obtained by stacking the first ceramic green sheets 7 and the second ceramic green sheets 8. More specifically, in order to obtain the green-sheet stack 1, a plurality of first ceramic green sheets 7 are stacked on a plurality of stacked second ceramic green sheets 8.

In the green-sheet stack 1, a shrinkage-reducing pad 9 is formed along a part of an interface between the first ceramic green sheets 7 and the second ceramic green sheets 8. The shrinkage-reducing pad 9 is made of a shrinkage-reducing material which reduces shrinkage stress produced at the interface between the first ceramic green sheets 7 and the second ceramic green sheets 8 in a firing process which will be described later. For this reason, for example, the shrinkage-reducing pad 9 contains a glass component. In order for the shrinkage-reducing pad 9 to properly serve the function of reducing shrinkage stress, it is preferable that the softening temperature of the glass component be lower than or equal to the shrinkage starting temperature of the first and second ceramic green sheets 7 and 8.

In a case in which the first and second ceramic green sheets 7 and 8 contain a glass component, as described above, it is preferable that the content of the glass component be less than the content of the glass component in the shrinkage-reducing pad 9. This is because the shrinkage-reducing pad 9 can properly reduce shrinkage stress.

Furthermore, it is preferable that the glass component contained in the shrinkage-reducing pad 9 include a constituent of the same type as that of the glass component contained in the first and second ceramic green sheets 7 and 8. This makes it possible to increase the bonding strength between the shrinkage-reducing pad 9 and the first and second ceramic green sheets 7 and 8 at the interface therebetween after firing. In order to increase the bonding strength, it is more preferable that the glass component contained in the shrinkage-reducing pad 9 be of the same type as the glass component contained in the first and second ceramic green sheets 7 and 8.

The shrinkage-reducing pad 9 is placed at the bottom end of the inner peripheral surface of the cavity 5 so that it is exposed on the entire periphery of the inner peripheral surface of the cavity 5. Such a shrinkage-reducing pad 9 is formed by, for example, preparing a paste of shrinkage-reducing material, and screen-printing the paste on a predetermined position on the first ceramic green sheet 7 or the second ceramic green sheet 8. Alternatively, a green sheet may be made of a paste containing a shrinkage-reducing material, and may be placed at a predetermined position on the first ceramic green sheet 7 or the second ceramic green sheet 8.

It is preferable that the area of the shrinkage-reducing pad 9 be more than or equal to about 10% of the area of the principal surface of the first ceramic green sheet 7. This is because the shrinkage-reducing pad 9 cannot satisfactorily work when the area thereof is less than about 10%.

It is preferable that the thickness of the shrinkage-reducing pad 9 be less than or equal to about 20% of the depth of the cavity 5. This is because the side wall portion of the cavity 5 is substantially deformed when the thickness of the shrinkage-reducing pad 9 exceeds about 20%.

Although not shown, inner conductive films in the green-sheet stack 1 are formed along specific interfaces between the ceramic green sheets 7 and 8, via-hole conductors are formed through specific ones of the ceramic green sheets 7 and 8, and outer conductive films are formed on the end faces 2 and 3.

Next, the green-sheet stack 1 is pressed in the sheet-stacking direction. In the pressing process, the peripheral portion of the cavity 5 is pressed, and the bottom face portion of the cavity 5 is pressed through the opening 4. More specifically, the green-sheet stack 1 is pressed by being subjected to hydrostatic pressing while being placed in a die (not shown) together with an elastic member such as silicon rubber.

Next, the green-sheet stack 1 is taken out of the die, and is then fired. More specifically, in the firing process, a degreasing step is first performed in a normal oxidizing atmosphere to decompose and remove organic components contained in the green-sheet stack 1, and a main firing step is performed.

In the above firing process, since the shrinkage-reducing pad 9 is exposed from the bottom end of the inner peripheral surface of the cavity 5 of the green-sheet stack 1, even when shrinkage stress is applied to the end of the bottom face portion of the cavity 5, when the temperature reaches the shrinkage starting temperature of the ceramic green sheets 7 and 8, the shrinkage-reducing pad 9 can be softened sufficiently. For this reason, the shrinking behavior of the first ceramic green sheets 7 and the second ceramic green sheets 8 can be separated at the interface therebetween, and shrinkage stress to be applied to the end of the bottom face portion of the cavity 5 can be reduced. As a result, it is possible to inhibit that portion from being cracked.

By thus firing the green-sheet stack 1 shown in FIG. 1, a multilayered ceramic substrate 10 can be obtained in a proper state, as shown in FIG. 2. In FIG. 2, components corresponding to those in FIG. 1 are denoted by the same numerals, and redundant descriptions thereof are omitted.

Referring to FIG. 2, the multilayered ceramic substrate 10 has a stack 13 in which first ceramic layers 11 obtained from the first ceramic green sheets 7 having openings 6, and second ceramic layers 12 obtained from the second ceramic green sheets 8 having no opening are stacked. The stack 13 also includes a cavity 5 which is defined by the openings 6 so that an aperture 4 is positioned on a first end face 2 in the sheet-stacking direction.

A shrinkage-reducing pad 9 is formed along a part of an interface between the first ceramic layers 11 and the second ceramic layers 12 so that it is exposed from the entire inner peripheral surface of the cavity 5 at the bottom end of the inner peripheral surface.

FIG. 3 is a sectional view illustrating a green-sheet stack 21 which is obtained in the course of the procedure for producing a multilayered ceramic substrate by a production method according to another embodiment of the present invention.

In the green-sheet stack 21 shown in FIG. 3, the forming manner of a shrinkage-reducing pad 22 is different from that of the shrinkage-reducing pad 9 shown in FIG. 1. That is, the shrinkage-reducing pad 22 is formed in a layer having a planar shape substantially identical to that of first ceramic green sheets 7 along an interface between the first ceramic green sheets 7 and second ceramic green sheets 8.

In order to form such a shrinkage-reducing pad 22, for example, a green sheet is obtained by shaping a paste containing a shrinkage-reducing material into a sheet, and is inserted between the first ceramic green sheets 7 and the second ceramic green sheets 8 in the process of forming the green-sheet stack 21.

Regarding the forming manner of the shrinkage-reducing pad, while the shrinkage-reducing pad 9 shown in FIG. 1 and the shrinkage-reducing pad 22 shown in FIG. 3 do not protrude onto the bottom surface of the cavity 5, they may protrude thereon as long as they do not interfere with the mounting of electronic components in the cavity 5.

Figure 4:
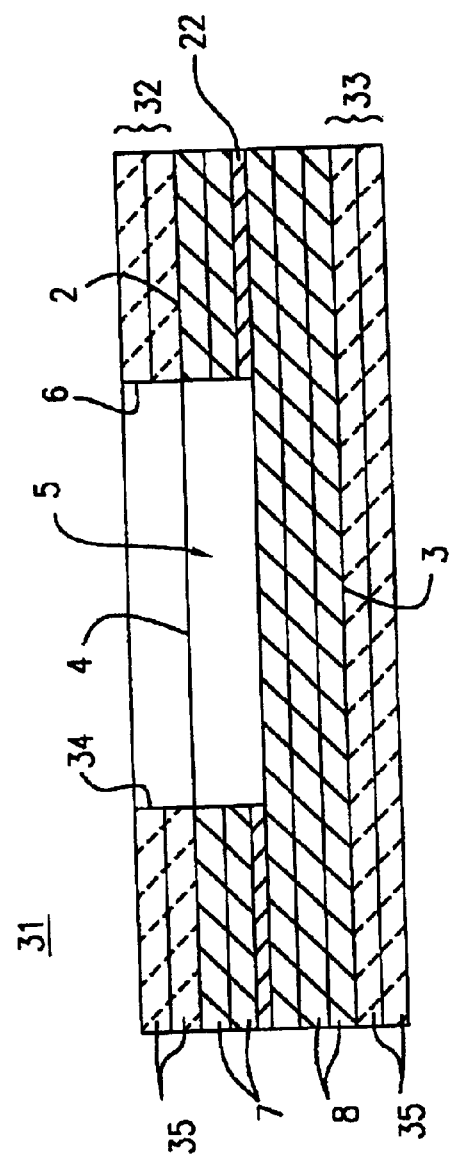
FIG. 4 is a sectional view illustrating a green-sheet stack which is obtained in the course of the procedure for producing a multilayered ceramic substrate by a production method according to a further embodiment of the present invention.

FIG. 4 is a sectional view illustrating a green-sheet stack 31 which is obtained in the course of the process for producing a multilayered ceramic substrate by a production method according to a further embodiment of the present invention. In FIG. 4, components corresponding to those in FIG. 1 or 3 are denoted by the same numerals, and redundant descriptions thereof are omitted.

The green-sheet stack 31 shown in FIG. 4 has a structure to which a so-called shrinkage-reducing process is applied, and includes components substantially identical to those in the green-sheet stack 21 shown in FIG. 3.

In order to obtain the green-sheet stack 31, a shrinkage-inhibiting inorganic material, whose firing temperature is higher than that of a ceramic material contained in first and second ceramic green sheets 7 and 8, is prepared in addition to the first and second ceramic green sheets 7 and 8, and the shrinkage-reducing material for forming a shrinkage-reducing pad 9 described above. In this case, it is preferable that the first and second ceramic green sheets 7 and 8 contain a glass component. The shrinkage-inhibiting inorganic material is, for example, alumina powder.

When producing the green-sheet stack 31, shrinkage-inhibiting layers 32 and 33 containing the shrinkage-inhibiting organic material are formed so as to cover first and second end faces 2 and 3 in the sheet-stacking direction of the first and second ceramic green sheets 7 and 8. The shrinkage-inhibiting layers 32 placed on the first end face 2 define an opening portion 34 from which an aperture 4 of a cavity 5 is exposed. Preferably, the opening portion 34 has a shape substantially identical to that of the aperture 4 of the cavity 5.

The above-described shrinkage-inhibiting layers 32 and 33 can be formed along the end faces 2 and 3, respectively, by forming inorganic material sheets 35 by shaping, into sheets, a slurry containing a shrinkage-inhibiting inorganic material, and stacking the inorganic material sheets 35 together with the first and second ceramic green sheets 7 and 8. In this case, the required thickness of the shrinkage-inhibiting layers 32 and 33 can be adjusted in accordance with the number of inorganic material sheets 35 to be stacked.

Next, the green-sheet stack 31 is pressed in the sheet-stacking direction together with an elastic member by hydrostatic pressing, as described with reference to FIG. 1. In this case, since the opening portion 34 is formed in the shrinkage-inhibiting layers 32, the bottom face portion of the cavity 5 can be pressed easily.

Next, the green-sheet stack 31 is fired. More specifically, a degreasing step is first performed in a normal oxidizing atmosphere in order to decompose and remove organic components contained in the green-sheet stack 31, and a main firing step is performed. It is preferable that a temperature of approximately 200° C. to 600° C. be applied in the degreasing step and that a temperature of approximately 800° C. to 1000° C. be applied in the main firing step. This allows only the ceramic material contained in the first and second ceramic green sheets 7 and 8 to be fired.

In the above firing process, the shrinkage-reducing pad 22 works to reduce shrinkage stress produced at the interface between the first ceramic green sheets 7 and the second ceramic green sheets 8, and to thereby inhibit the end of the bottom face portion of the cavity 5 from being cracked.

Since the shrinkage-inhibiting inorganic material contained in the shrinkage-inhibiting layers 32 and 33 is substantially not fired in the firing process, shrinkage will not occur in the shrinkage-inhibiting layers 32 and 33. Therefore, the ceramic green sheets 7 and 8 in the green-sheet stack 31 are shrunk only in the thickness direction in the firing process. Shrinkage in the direction of the principal surface can be substantially avoided because it is restrained by the shrinkage-inhibiting layers 32 and 33.

In this way, a multilayered ceramic substrate can be obtained in a proper state by firing the green-sheet stack 31. In normal cases, the shrinkage-inhibiting layers 32 and 33 are removed after the multilayered ceramic substrate is thus obtained.

While the second ceramic green sheets 8 do not have an opening for forming the cavity in the embodiments described above with reference to the drawings, at least some of them may have an opening at a position not corresponding to the position of the openings 6 of the first ceramic green sheets 7.

Description will be given below of experiments carried out in order to confirm the advantages of the present invention.

FIRST EXAMPLE

In the first example, a green-sheet stack having the structure shown in FIG. 1 was produced and fired, thereby obtaining a multilayered ceramic substrate having the structure shown in FIG. 2. As the green-sheet stack, a multilayered mother stack was produced which could be divided into a plurality of multilayered ceramic substrates.

First, in order to obtain a green-sheet stack of 100 mm square in plan view in which a plurality of cavities were distributed, first ceramic green sheets having a plurality of openings and second ceramic green sheets having no opening were prepared and stacked, and a shrinkage-reducing pad was formed by applying a shrinkage-reducing material paste containing a glass component onto the interface between the first ceramic green sheets and second ceramic green sheets.

The softening temperature of the glass component contained in the shrinkage-reducing pad was less than or equal to the shrinkage starting temperature of the first and second ceramic green sheets. The area of the shrinkage-reducing pad is set to be more than or equal to about 20% of the area of the principal surface of the first ceramic green sheet. The depth of the cavities was set at 300 $\mu$m, and the thickness of the shrinkage-reducing pad was set at 30 $\mu$m.

Next, the whole green-sheet stack obtained as described above was put into a plastic bag together with an elastic member, and was vacuum-packed in the bag. The vacuum-packed green-sheet stack was put into a tank of a hydrostatic pressing apparatus together with a die, and was pressed at 2000 kgf/cm$^2$ at 60° C.

After the pressed green-sheet stack was taken out of the bag, it was subjected to a degreasing step at 450° C. for four hours and to a main firing step at 1400° C. for twenty minutes while not being pressed.

In this way, the multilayered mother stack to be divided into multilayered ceramic substrates having a cavity could be produced without causing cracking at the end of the bottom face portion of the cavity.

SECOND EXAMPLE

In the second example, a green-sheet stack having the structure shown in FIG. 4 was produced and fired, thereby obtaining a multilayered ceramic substrate. As the green-sheet stack, a multilayered mother stack was produced in a manner similar to that in the first example.

First, in order to obtain a green-sheet stack of 100 mm square in plan view in which a plurality of cavities were distributed, first ceramic green sheets having a plurality of openings and second ceramic green sheets having no opening were prepared. The ceramic green sheets had a composition containing a glass component.

A shrinkage-reducing material green sheet having the same shape of the first ceramic green sheets was made of a shrinkage-reducing material containing a glass component which was to become a shrinkage-reducing pad. The glass component contained in the shrinkage-reducing material was of the same type as the glass component contained in the ceramic green sheets.

Inorganic material sheets containing a shrinkage-reducing inorganic material powder were made from a slurry containing alumina powder for forming shrinkage inhibiting layers.

Next, a green-sheet stack was constituted by the first and second ceramic green sheets, the shrinkage-reducing material green sheet, and the inorganic material sheets described above. That is, the green-sheet stack was produced by placing the shrinkage-reducing material green sheet between the first ceramic green sheets and the second ceramic green sheets in order to form a shrinkage-reducing pad therebetween, and placing the inorganic material sheets so that shrinkage-inhibiting layers sandwiched the first and second ceramic green sheets which were stacked with the shrinkage-reducing pad therebetween. In the green-sheet stack, the depth of the cavities was set at 300 μm, and the thickness of the shrinkage-reducing pad was set at 30 μm.

Next, the green-sheet stack obtained as described above was pressed in a manner similar to that in the first example.

After the pressed green-sheet stack was taken out of a bag, it was subjected to a degreasing step at 450° C. for four hours, and to a main firing step at 900° C. for twenty minutes while not being pressed.

In this way, the multilayered mother stack to be divided into multilayered ceramic substrates having a cavity could be produced without causing cracking at the end of the bottom face portion of the cavity.

COMPARATIVE EXAMPLE

In this comparative example, a multilayered mother stack to become multilayered ceramic substrates having a cavity was produced by the same operations as those in the first example except that a shrinkage-reducing pad was not formed. As a result, a crack having a depth of approximately 10 μm was produced at the end of the bottom face portion of the cavity.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for producing multilayered ceramic substrate having a cavity comprising the steps of:
   providing a first ceramic green sheet having an opening for forming a cavity, and a second ceramic green sheet having no opening at a position corresponding to said opening of the first ceramic green sheet;
   providing a first shrinkage-reducing material for reducing shrinkage stress produced at a boundary between said first ceramic green sheet and said second ceramic green sheet;
   forming a green-sheet stack having a cavity defined by said opening by stacking said first ceramic green sheet, said second ceramic green sheet and said first shrinkage-reducing material so that an aperture of said cavity is disposed on at least one end face of said stacked ceramic green sheets in a sheet-stacking direction and extends through a depth of said stack to an inner peripheral surface while positioning a shrinkage-reducing layer comprising said first shrinkage-reducing material along said boundary between said first ceramic green sheet and said second ceramic green sheet but less than the entire surface of the second green sheet at the position corresponding to said opening of the first ceramic green sheet so that said shrinkage-reducing layer is exposed at an end of said inner peripheral surface of said cavity; and
   firing said green-sheet stack.

2. The method for producing multilayered ceramic substrate having a cavity according to claim 1, wherein said shrinkage-reducing layer is exposed on the entire periphery of the inner peripheral surface of said cavity as a shrinkage-reducing pad.

3. The method for producing multilayered ceramic substrate having a cavity according to claim 2, wherein said shrinkage-reducing pad has a surface substantially parallel to a surface of said first ceramic green sheet defining said one end face and wherein said shrinkage-reducing pad surface has an area which is more than or equal to about 10% of the area of said surface of said first ceramic green sheet to which it is substantially parallel.

4. The method for producing multilayered ceramic substrate having a cavity according to claim 2, wherein said shrinkage-reducing pad comprises a thick film layer having a planar surface substantially identical to that of said first ceramic green sheet along said boundary between said first ceramic green sheet and said second ceramic green sheet.

5. The method for producing multilayered ceramic substrate having a cavity according to claim 2, wherein said shrinkage-reducing pad has a thickness which is less than or equal to about 20% of the depth of said cavity.

6. The method for producing multilayered ceramic substrate having a cavity according to claim 1, further comprising:
   providing a second shrinkage-inhibiting material comprising an inorganic material having a firing temperature higher than that of a ceramic material contained in said first and second ceramic green sheet,
   during said forming said green-sheet stack, forming a two additional shrinkage-inhibiting layers each of which comprise said second shrinkage-inhibiting material so as to cover both end faces of said green-sheet stack in the sheet-stacking direction while said opening is formed so as to expose said aperture of said cavity therefrom, and
   firing said green-sheet stack under conditions that said inorganic material contained in said additional shrinkage-inhibiting layers is not fired.

7. The method for producing multilayered ceramic substrate having a cavity according to claim 6, further comprising removing said additional shrinkage-inhibiting layers after said firing.

8. A method for producing multilayered ceramic substrate having a cavity comprising the steps of:
   providing a first ceramic green sheet having an opening for forming a cavity, and a second ceramic green sheet having no opening at a position corresponding to said opening of the first ceramic green sheet;
   providing a first shrinkage-reducing material for reducing shrinkage stress produced at s boundary between said first ceramic green sheet and said second ceramic green sheet;
   forming a green-sheet stack having a cavity defined by said opening by stacking said first ceramic green sheet, said second ceramic green sheet and said first shrinkage-reducing material so that an aperture of said cavity is disposed on at least one end face of said stacked ceramic green sheets in a sheet-stacking direction and extends through a depth of said stack to an inner peripheral surface while positioning a shrinkage-reducing pad comprising said first shrinkage-reducing material along said boundary between said first ceramic green sheet and said second ceramic green sheet so that said shrinkage-reducing pad is exposed at the entire periphery of said inner peripheral surface of said cavity; and
   firing said green-sheet stack,
   wherein said shrinkage-reducing pad comprises a glass component, and the softening temperature of said glass component is less than or equal to the shrinkage starting temperature of said first and second ceramic green sheets.

9. The method for producing multilayered ceramic substrate having a cavity according to claim 8, wherein said first and second ceramic green sheets comprise a glass component.

10. The method for producing multilayered ceramic substrate having a cavity according to claim 9, wherein the content of said glass component in said first and second ceramic green sheets is less than the content of said glass component in said shrinkage-reducing pad.

11. The method for producing multilayered ceramic substrate having a cavity according to claim 10, wherein said glass components contained in said shrinkage-reducing pad and said first and second ceramic green sheets have a common constituent.

12. The method for producing multilayered ceramic substrate having a cavity according to claim 11, wherein a glass component contained in said shrinkage-reducing pad is the same as a glass component contained in said first and second ceramic green sheets.

* * * * *